United States Patent [19]

Tavernetti

[11] Patent Number: 5,745,062
[45] Date of Patent: Apr. 28, 1998

[54] PULSE WIDTH MODULATION ANALOG TO DIGITAL CONVERTER

[75] Inventor: Russell E. Tavernetti, San Carlos, Calif.

[73] Assignee: Zircon Corporation, Campbell, Calif.

[21] Appl. No.: 513,302

[22] Filed: Aug. 10, 1995

[51] Int. Cl.[6] .................................................. H03M 1/50
[52] U.S. Cl. ............................................. 341/135; 341/166
[58] Field of Search ................................. 341/135, 155, 341/166

[56] References Cited

U.S. PATENT DOCUMENTS

| | | | |
|---|---|---|---|
| 4,023,160 | 5/1977 | Kirschner | 340/347 NT |
| 4,225,913 | 9/1980 | Bray | 363/97 |
| 4,588,984 | 5/1986 | Dorsman | 340/347 NT |
| 4,598,270 | 7/1986 | Shutt et al. | 340/347 NT |
| 4,810,912 | 3/1989 | Theus et al. | 307/585 |
| 5,272,451 | 12/1993 | Yamate et al. | 331/2 |
| 5,293,077 | 3/1994 | Seki et al. | 323/282 |
| 5,432,693 | 7/1995 | Anderson | 363/41 |
| 5,579,006 | 11/1996 | Hasegawa et al. | 341/135 |

*Primary Examiner*—Marc S. Hoff
*Attorney, Agent, or Firm*—Skjerven, Morrill, MacPherson, Franklin & Friel LLP; Norman R. Klivans

[57] ABSTRACT

A pulse width modulation analog to digital converter can accommodate both wide band AC analog input signals and DC analog input signals. If the frequency of the input signal is much higher than the conversion rate of the PWM analog to digital converter, then the output digital pulse is of constant width versus the analog input signal amplitude. If the frequency of the analog input signal is lower than the conversion rate, then the output digital signal is a train of variable width pulses whose width tracks the amplitude of the analog input signal.

5 Claims, 2 Drawing Sheets

80KHZ INPUT

A/D PULSE

60 HZ INPUT

A/D PULSE

PULSE WIDTH MODULATION ANALOG TO DIGITAL CONVERTER

BACKGROUND OF THE INVENTION

1. Field of the Invention

This invention relates to analog to digital converters and more specifically to a pulse width modulation analog to digital converter.

2. Description of the Prior Art

Analog to digital converters are well known. These accept an input analog signal having a particular amplitude (voltage) at any given time and convert it to a digital type signal, i.e. a pulse signal usable by digital-type circuitry. Thus the object of an analog to digital converter is to determine an output digital "word" (signal) corresponding to an analog input signal. Analog to digital converters generally require a sample and hold circuit at the input because it is not possible to convert a changing analog input signal; that is, the conversion must be made of the amplitude (voltage) of the analog input signal at some particular time. A typical analog to digital converter samples and holds the input signal and then applies the sampled input signal to a set of comparators each having an individual fixed reference level applied to its inverting input terminal, with the input analog signal applied to its noninverting input terminal. The output terminals of each of the comparators are connected to a decoder circuit which provides a digital output corresponding to the voltage level of the analog input signal.

A pulse width modulation (PWM) analog to digital converter operates somewhat differently; it outputs, in response to an input analog signal, a variable width pulse. The width of the pulse is proportional to the amplitude of the analog input signal. Thus in a PWM analog to digital converter instead of the output signal being a stream of digital pulses, each output pulse length represents the amplitude of the analog input signal at a particular time.

Most analog to digital converters are designed to accept input signals having particular characteristics, i.e. a direct current signal, a low frequency (alternating current) signal, or a high frequency alternating current input signal. Thus analog to digital converters are typically designed to function in a particular environment depending upon the nature of the analog input signal.

However, it would be desirable to have an analog to digital converter that is capable of accepting both wide band (wide frequency range) alternating current and also direct current analog input signals. No such device is known heretofore.

SUMMARY

In accordance with the invention, a PWM analog to digital converter can accommodate both wide band alternating current and direct current input signals, and provide in response a pulse width modulation output signal having a pulse duration indicating an amplitude of the input signal. In one embodiment of the present invention, the pulse duration is inversely proportional to the input signal amplitude. If the frequency of the input signal is much higher than that of the converter conversion rate, then the present analog to digital converter averages the signal over several cycles and provides a (digital) output pulse of constant width. If the frequency of the input signal is lower than the converter's conversion rate, then the converter provides an output signal which is a train of pulses of variable width whose width tracks the amplitude of the input signal.

The present PWM analog to digital converter includes a diode connected between the input terminal and ground, to clamp an alternating current input signal to ground. The clamped input signal is provided to the base (control terminal) of a first transistor. Any input signal variations cause the first transistor to generate an output signal current, which along with a bias current, is mirrored by a current mirror into an integrating capacitor. The voltage across the capacitor is detected by a timer. The capacitor is then discharged when the voltage on the capacitor reaches a predetermined level. Thus the timer, in conjunction with a microprocessor (microcontroller) which clocks the timer to initiate a conversion cycle and measures the output pulse duration, acts as an analog level to pulse width converter.

BRIEF DESCRIPTION OF THE DRAWINGS

FIGS. 2A, 2B, 2C, and 2D show waveforms in accordance with the present invention wherein FIGS. 2A and 2C show input waveforms and FIGS. 2B and 2D show corresponding output waveforms.

DETAILED DESCRIPTION OF THE INVENTION

Figure 1:
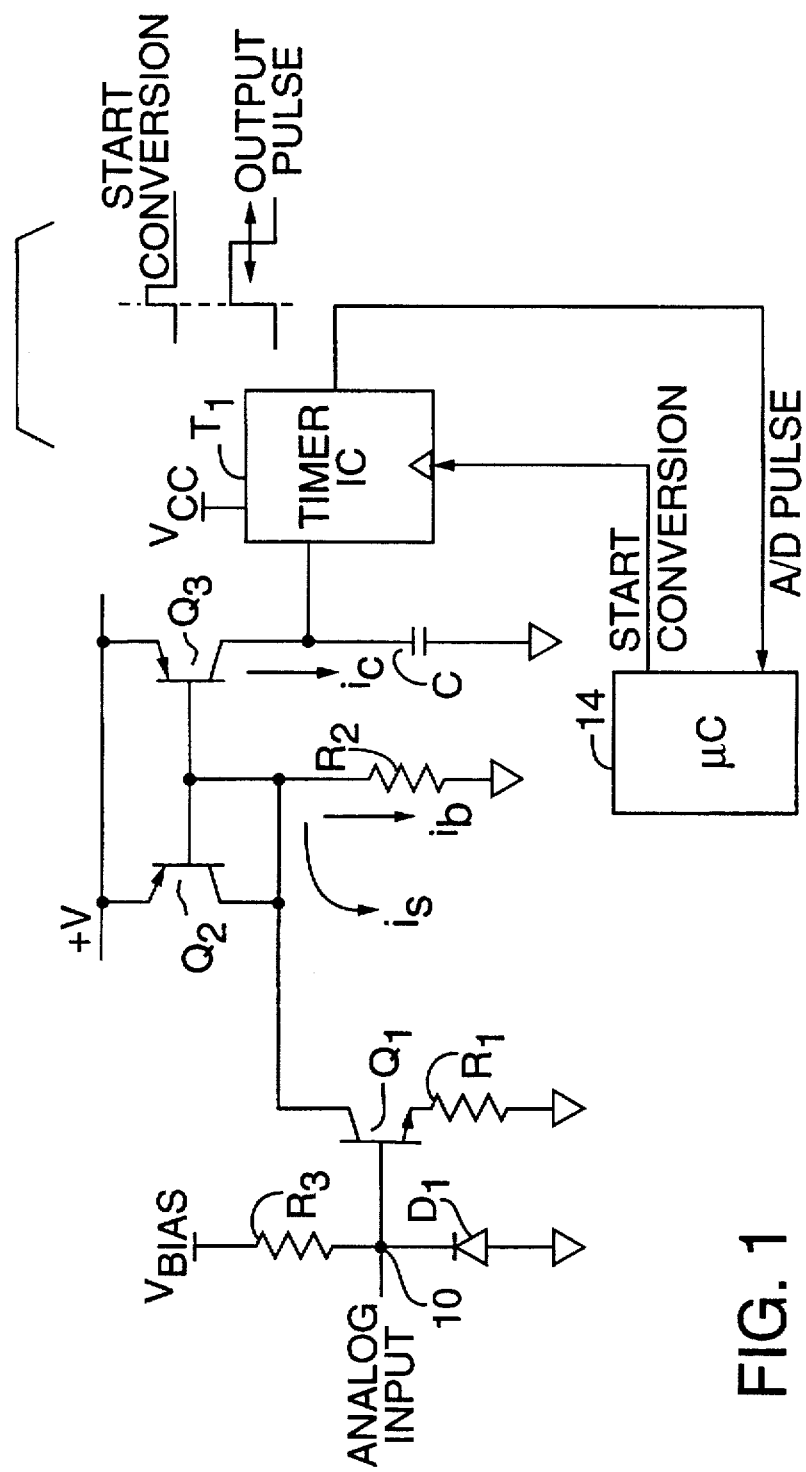
FIG. 1 shows an analog to digital converter in accordance with the present invention.

FIG. 1 shows a PWM analog to digital converter in accordance with the invention. The analog input signal is applied to input terminal (node) 10. As described above, one advantage of the present analog to digital converter is that it can accommodate both wideband AC input signals and DC input signals. Thus it is suitable for use for instance in an instrument or system which generates various types of analog signals to be converted to a digital form. For instance, one use of the present converter is in an instrument where a single converter provides a digital representation of e.g. a battery voltage (to indicate a low battery condition) and also to provide an indication of the actual instrumentation measurement. In this case the battery voltage is a DC signal, and the instrument measurement would typically be an AC signal. Furthermore, in some instruments multiple types of read outs are provided, in which case some of the read outs may be of a high frequency AC signal and others may be of a low frequency AC signal, for instance where the instrument has multiple functions. In this case the present analog to digital converter can accommodate both of these instrument read outs as well as measuring the battery voltage and provide a digital indication of all of these parameters. Thus the present analog to digital converter improves the economy of manufacture of such an instrument by allowing a single analog to digital converter to be used for displaying multiple different types of input signals.

In the circuit of FIG. 1, the input diode D1 clamps to ground an AC input signal applied at node 10. Any signal variations in the analog input signal at node 10 cause transistor Q1, which is biased to near conduction by bias resistor R1, to generate a signal current $i$ at the collector terminal of transistor Q2. In this schematic, transistors Q1, Q2 and Q3 are shown as bipolar (NPN) type transistors but they may be field effect transistors as is readily understood by one skilled in the art. Current $i_s$, along with a bias current $i_b$ through resistor $R_2$, is mirrored by a third transistor Q3 into the integration capacitor C. Thus, transistors Q2 and Q3 together function as a Wilson type current mirror. Other current mirrors may be used. Voltage +V connected to transistors Q2 and Q3 may or may not be Vcc.

The integrating capacitor C (integrator) is connected at its uppermost plate to the data input terminal of timer circuit T1 which is also coupled to power supply Vcc. Timer circuit T1 is e.g. an integrated circuit, for instance part number LM555 supplied by National Semiconductor Corp. et al., which detects the voltage across the plates of capacitor C. Timer circuit T1 is automatically reset (discharges capacitor C) when the measured voltage across capacitor C reaches a predetermined level (e.g. ⅔ of the timer circuit voltage supply). At this time the timer circuit T1 terminates the output signal on its output terminal; this output signal is a PWM pulse, as shown by the waveform illustrated at the right side of timer circuit T1. The duration of this pulse is inversely proportional to the amplitude of the analog input signal at node 10.

This PWM pulse is coupled to an input terminal of a microprocessor (or microcontroller) 14. At the rising edge of the PWM pulse, the microcontroller 14 starts a high speed internal counter. The counter stops counting at the falling edge of the PWM pulse. The state of the counter then holds a value proportional to the pulse width. To begin a new conversion cycle, the microcontroller 14 issues a new start conversion pulse to the timer circuit T1, as shown in the upper right of FIG. 1.

Thus this analog to digital converter can accommodate both wideband AC input signals and DC input signals. If the frequency of the input analog signal is much higher than the conversion rate (the sampling rate), then the integrating capacitor C averages the input signal amplitude and the output pulse is of constant width over several cycles of the input signal. This would typically be the case for instance when the analog input signal is a high frequency AC signal and the sampling rate is a lower frequency.

Figure 2A:
Figure 2B:
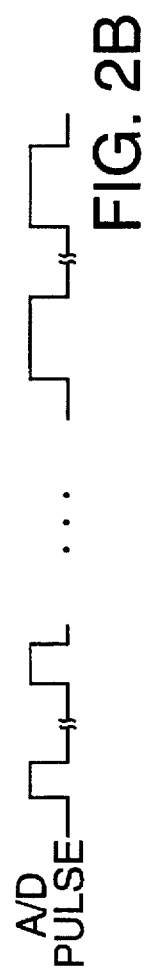

This is illustrated in FIGS. 2A and 2B where an 80 KHz input signal as shown in FIG. 2A is converted to a PWM pulse as shown in FIG. 2B of constant width over a number of cycles, due to the sampling rate being much lower than the 80 KHz input signal frequency.

Figure 2C:
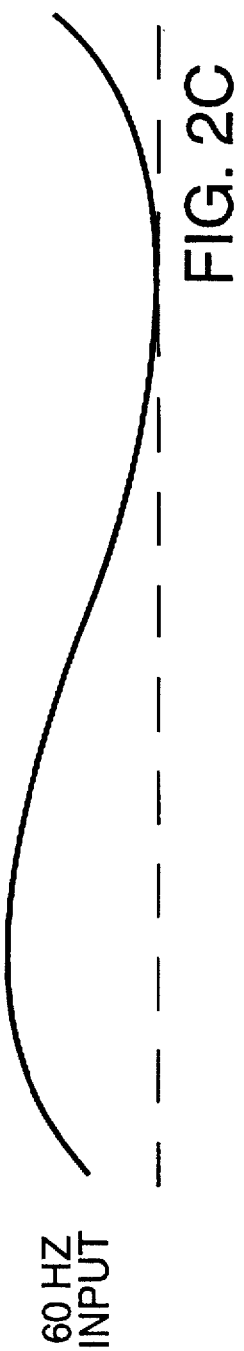
Figure 2D:
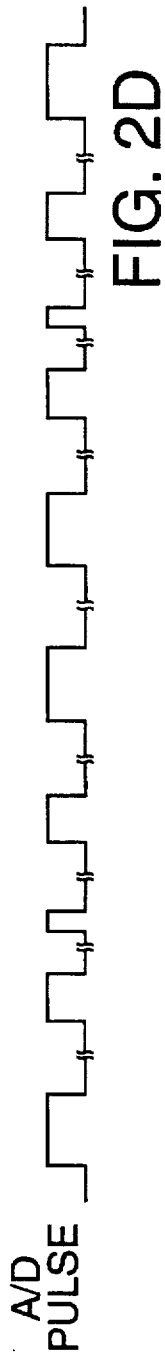

In contrast, in FIG. 2C an analog input signal at node 10 is a 60 Hz input signal, so the corresponding converted PWM output signal in FIG. 2D constantly tracks, in terms of pulse widths, the amplitude of the input signal. Thus, FIGS. 2C and 2D illustrate the case where the input frequency of 60 Hz is lower than the predetermined sample rate of e.g. 480 Hz. Then the PWM output signal is a train of varied width pulses whose width constantly tracks that of the amplitude of the input signal.

This description is illustrative and not limiting. For instance, various equivalent circuit elements or circuits can be substituted for the elements shown in FIG. 1 in accordance with the present invention. There is no requirement for a microcontroller or microprocessor to start the conversion, but another element can perform this function and also the microcontroller or microprocessor need not be the recipient of the digital PWM pulse but another circuit element may be the recipient; microprocessor 14 is shown as the recipient here for simplicity. For instance, the output pulse may be used to directly drive a display. The values of the components shown in FIG. 1 are not critical. However, typical values for components R1, R2, and R3 are respectively (in ohms) 10K, 100K, 100K. A typical value for capacitor C is 0.1 µF. (These values depend on the relative bandwidth and amplitude of the analog input signals). The conversion rate (how often the start conversion signal is issued) in this particular circuit is determined by the microprocessor, but it may be determined by other elements.

Also, while for instance the transistors herein are shown as discrete components, they need not be and may be integrated into an integrated circuit along with the other elements as suitable.

Therefore the present disclosure is illustrative and not limiting and further modifications will be apparent to one skilled in the art in light of this disclosure.

We claim:

1. A pulse width modulation analog to digital converter comprising:

an analog signal input terminal;

a diode connected between the analog signal input terminal and a reference voltage;

a first transistor having its control terminal connected to the signal input terminal and having two current handling terminals, a first of which is connected to the reference voltage;

a current mirror having an input terminal connected to the second current handling terminal of the first transistor and having an output terminal;

an integrator connected to the output terminal of the current mirror; and a timer having an input terminal coupled to the integrator, the timer providing at an output terminal a PWM output signal.

2. The converter of claim 1, wherein the integrator includes a capacitor.

3. The converter of claim 1, wherein the timer has a data input terminal coupled to the integrator; and further including:

a processor having an input terminal connected to the output terminal of the timer and having an output terminal connected to a clock terminal of the timer.

4. The converter of claim 1, wherein the current mirror includes a second and a third transistor, each having its control terminal connected to the second current handling terminal of the first transistor, and a first current handling terminal connected to a voltage supply, wherein a second current handling terminal of the second transistor is connected to its control terminal, and the second current handling terminal of the third transistor is connected to the integrator.

5. A method of converting an analog signal to a pulse width modulation signal at a particular conversion rate, the method comprising the steps of:

clamping the analog input signal;

generating a first current having a level corresponding to a voltage of the clamped signal;

mirroring the first current to provide a second current;

integrating the second current over time;

detecting a voltage of the integrated second current; and when the detected voltage reaches a predetermined level, providing a pulse width modulation signal having a duration related to an amount of the integrated current;

wherein, at any given time, the analog signal is selected from a group consisting of a direct current signal, an alternating current signal with a frequency higher than the particular conversion rate, and an alternating current signal with a frequency lower than the particular conversion rate.

* * * * *